United States Patent
Ke et al.

(10) Patent No.: US 6,696,886 B1
(45) Date of Patent: Feb. 24, 2004

(54) AUTOMATICALLY ADJUSTING GAIN/BANDWIDTH LOOP FILTER

(75) Inventors: Chun-Nan Ke, Taichung (TW); Cheng-Yi Huang, Yiilan (TW); Chih-Peng Fan, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/369,080

(22) Filed: Feb. 13, 2003

(30) Foreign Application Priority Data

Nov. 18, 2002 (TW) ........................................ 91133581 A

(51) Int. Cl.[7] ................................................ H03K 5/00
(52) U.S. Cl. ........................ 327/553; 327/558; 327/156
(58) Field of Search ................................. 327/156, 553, 327/558, 552

(56) References Cited

U.S. PATENT DOCUMENTS

| | | | | |
|---|---|---|---|---|
| 4,539,526 A | * | 9/1985 | Davis | .......................... 330/144 |
| 6,185,262 B1 | * | 2/2001 | Brandstetter | .................. 331/18 |
| 6,356,217 B1 | * | 3/2002 | Tilley et al. | ................. 455/138 |
| 6,429,734 B1 | * | 8/2002 | Wang et al. | ................. 327/558 |

\* cited by examiner

*Primary Examiner*—Dinh T. Le
(74) *Attorney, Agent, or Firm*—J C. Patents

(57) ABSTRACT

An automatically adjusting gain/bandwidth loop filter suitable for a digital phase lock loop or a digital adaptive carrier recovery loop with variable loop gain/bandwidth for rapid acquisition and lower steady-state jitter is provided. The automatically adjusting gain/bandwidth loop filter comprises a variable gain/bandwidth loop filter, a tracking status detector and a gain/bandwidth control state machine. The tracking status detector observes the frequency error which is the output of the frequency tracking (integral) branch of the variable gain/bandwidth loop filter, then it outputs a tracking state of the carrier recovery loop. The loop gain/bandwidth is then adjusted by the gain/bandwidth control state machine in response of the tracking state to improve the pull-in time and steady-state carrier frequency jitter.

20 Claims, 6 Drawing Sheets

AUTOMATICALLY ADJUSTING GAIN/BANDWIDTH LOOP FILTER

CROSS-REFERENCE TO RELATED APPLICATION

This application claims the priority benefit of Taiwan application Ser. No.91133581, filed on Nov. 18, 2002.

BACKGROUND OF THE INVENTION

1. Field of Invention

The present invention generally relates to a loop filter, and more particularly, to an automatically adjusting gain/bandwidth loop filter that applies to a digital adaptive carrier recovery loop or a digital phase lock loop.

2. Description of Related Art

The phase lock loop (PLL) is used by the quadrature amplitude modulation (abbreviated as QAM) system in conventional communication for carrier recovery operation. However, the phase lock loop with conventional fixed parameters has its disadvantage. When a user intends to increase the carrier tracking speed or the carrier frequency tracking range, a phase lock loop with high gain/bandwidth is required. However, when such method is used for the carrier recovery operation, the jitter generated when entering into the steady-state is also increased. Whereas, the phase lock loop with low gain/bandwidth is required when user intends to lower the steady-state jitter. However, this mechanism delays the time for carrier locking, i.e. delays the pull-in time, and also lowers the maximum residual carrier frequency offset that can be tracked.

A QAM system using a weight computation circuit to modify the loop filter gain is disclosed in "A New Symbol Synchronizer with Reduced Timing Jitter for QAM systems", Volume: 2, Page 1292–1296, Global Telecommunications Conference IEEE, 1995 by Zhang Hang and Markku Renfors. However, an additional carrier recovery circuit, or a synchronizer, is required by such QAM system for generating a signal for judgment, thus the hardware cost is increased. In addition, the calculated and adjusted gain may be too big, so that the whole circuit is diverged. Moreover, since it only adjusts the loop filter gain and does not adjust the loop filter bandwidth, it cannot provide the best results.

The other carrier recovery circuit is disclosed in "Adaptive Carrier Tracking Circuit" of U.S. patent application Ser. No. 4,691,176, where in addition to the complicated channel characteristic estimator, a carrier recovery circuit that causes an additional cost is also used to calculate the situation of the current environment. An output signal from the phase detector is used by the carrier recovery circuit as a source of the judgment signal.

The present invention provides an automatically adjusting gain/bandwidth loop filter. A frequency error in the frequency tracking (integral) branch of the variable gain/bandwidth loop filter is used to estimate a tracking state of the loop without the help of an additional synchronizer. The loop gain/bandwidth is further adjusted based on the tracking state to accelerate the pull-in time and lower the steady-state jitter. Moreover, the circuit can be steadily operated, thus the divergence will not happen anymore.

SUMMARY OF THE INVENTION

In order to achieve the object mentioned above and others, the present invention provides an automatically adjusting gain/bandwidth loop filter. The loop filter comprises a variable gain/bandwidth loop filter and a tracking controller. The variable gain/bandwidth loop filter mentioned above filters a noise component included in a first received phase error, and adjusts a gain/bandwidth of the variable gain/bandwidth loop filter according to the tracking control tuning parameter output from the tracking controller, so as to output a second phase error and a frequency error related to a frequency tracking portion in the second phase error. The tracking controller determines a tracking status of the loop that is currently used according to the frequency error, and adjusts and outputs a tracking control tuning parameter used for tuning the gain/bandwidth of the variable gain/bandwidth loop filter.

The tracking controller of the preferred embodiment according to the present invention mentioned above comprises a tracking status detector and a gain/bandwidth control state machine. The tracking status detector determines a tracking status of the loop currently used according to the frequency error, so as to obtain a confidence value that represents the tracking status. The gain/bandwidth control state machine adjusts and outputs a tracking control tuning parameter according to the confidence value. The tracking control tuning parameter comprises a gain tuning parameter and a bandwidth tuning parameter, wherein the gain tuning parameter is used for tuning the gain of the variable gain/bandwidth loop filter, and the bandwidth tuning parameter is used for tuning the bandwidth of the variable gain/bandwidth loop filter.

The tracking status detector of the preferred embodiment comprises a variation calculator, a comparator set, and a confidence counter. The variation calculator calculates a representative variation value that relates to a variation of the frequency error within a time period. The variation calculator comprises a summation unit, a delay unit, an adder, and an absolute value operator. The summation unit receives the frequency error, summates the frequency error within a time period, and outputs a summation value. The delay unit then delays the summation value for a time unit, and the adder subtracts the delayed summation value from the summation value. The absolute value operator then extracts an absolute value from the output value of the adder, so as to obtain a representative variation value. The comparator set compares the representative variation value with the default upper threshold and the default lower threshold, so as to output a counting control parameter. The counting control parameter comprises a downward counting and an upward counting. The comparator set comprises a first comparator and a second comparator. The first comparator compares the representative variation value with the upper threshold, and activates the downward counting if the representative variation value is greater than the upper threshold, so as to decrease the confidence value. The second comparator compares the representative variation value with the lower threshold, and activates the upward counting if the representative variation value is less than the lower threshold, so as to increase the confidence value. As a result, the confidence calculator mentioned above increases or decreases the output confidence value according to the upward or the downward counting of the counting control parameter.

The gain/bandwidth control state machine of the preferred embodiment comprises the following mode steps: an acquisition mode for increasing gain/bandwidth, a hold mode for holding gain/bandwidth, and a steady mode for lower gain/bandwidth. Wherein, when a confidence value is less than a pre-determined default acquisition confidence value, the gain/bandwidth is increased; when the confidence value is greater than the pre-determined default steady-state confidence value, the gain/bandwidth is reduced; otherwise, the gain/bandwidth is held. Furthermore, before the gain/bandwidth of the variable gain/bandwidth loop filter is adjusted to a higher value by a gain/bandwidth control state machine, first determining whether the gain/bandwidth is greater than a pre-determined maximum margin value or not, if it is, the gain/bandwidth is held; or before adjusting the gain/bandwidth of the variable gain/bandwidth loop filter to a lower value, determining whether the gain/bandwidth is less than a pre-determined minimum margin value, if it is, the gain/bandwidth is also held.

The variable gain/bandwidth loop filter of the preferred embodiment according to the present invention comprises a phase tracking branch, a frequency tracking branch, and an adder. The phase tracking branch weight the first phase error and obtains a phase tracking related portion contained in the second phase error according to the tracking control tuning parameter. The phase tracking branch also comprises a multiplier, which is used for multiplying a ratio coefficient of the gain tuning parameter included in the tracking control tuning parameter by the first phase error. The frequency tracking branch operates and processes the first phase error according to the tracking control tuning parameter, so as to obtain a frequency tracking related portion included in the second phase error and obtain a frequency error. The adder then summates the outputs from the phase tracking branch and the frequency tracking branch, so as to obtain a second phase error.

The frequency tracking branch mentioned above comprises a first multiplier, an adder, a delay unit, and a second multiplier. The first multiplier multiplies an integral coefficient of the gain tuning parameter included in the tracking control tuning parameter by the first phase error. The adder then summates the outputs from the first multiplier and the second multiplier, and outputs the result to the delay unit. The delay unit delays the output from the adder to obtain the frequency error. The second multiplier multiplies a bandwidth tuning parameter included in the tracking control tuning parameter by the frequency error, and feedbacks the result to the adder.

In accordance with the other aspect of the present invention, there is provided an automatically adjusting gain/bandwidth method for a variable gain/bandwidth loop filter. The method comprises the steps: first, receiving a first phase error; then, filtering a noise component included in the first phase error mentioned above, so as to obtain a second phase error, and according to a set of the tracking control tuning parameters, adjusting the gain/bandwidth used for the filter operation and obtaining a frequency error that is related to the frequency tracking portion and included in the second phase error; determining a tracking status of the loop that is currently used according to the frequency error, and further adjusting and outputting a tracking control tuning parameter used for tuning the gain/bandwidth mentioned above according to the tracking status.

In accordance with the preferred embodiment of the present invention, the step for determining the tracking status of the carrier recovery loop currently used according to the frequency error further comprises the steps: first, calculating a representative variation value related to the frequency error variation within a time period; then, comparing the representative variation value with the default upper threshold and the default lower threshold, and outputting a counting control parameter; increasing/decreasing and outputting a confidence value that represents the tracking status according to the counting control parameter. The step for calculating the representative variation value further comprises the steps: first, summing the frequency error within a time period, and outputting a summation value; then, delaying the summation value for a time unit; subtracting the delayed summation value from the summation value; extracting an absolute value from the result after subtracting the delayed summation value from the summation value, so as to obtain the representative variation value. In addition, the counting control parameter comprises a downward counting and an upward counting. The step for obtaining the counting control parameter comprises the steps: comparing the representative variation value with the upper threshold, and activating the downward counting if the representative variation value is greater than the upper threshold, so as to decrease the confidence value; comparing the representative variation value with the lower threshold, and activating the upward counting if the representative variation value is less than the lower threshold, so as to increase the confidence value.

In accordance with the preferred embodiment of the present invention, the tracking status comprises an acquisition mode, a hold mode, and a steady mode. The step for adjusting and outputting the tracking control tuning parameter according to the tracking status, so as to further adjust the gain/bandwidth further comprises the steps of: when a confidence value is less than a pre-determined default acquisition confidence value, entering into the acquisition mode so as to increase the gain/bandwidth; when the confidence value is greater than the pre-determined default steady-state confidence value, entering into the steady mode so as to reduce the gain/bandwidth; otherwise, entering into the hold mode so as to hold the gain/bandwidth. Furthermore, in the step mentioned above, before increasing the gain/bandwidth, first determining whether the gain/bandwidth is greater than a pre-determined maximum margin value or not, if it is, entering into the hold mode so as to hold the gain/bandwidth; or before reducing the gain/bandwidth, determining whether the gain/bandwidth is less than a pre-determined minimum margin value, if it is, also entering into the hold mode so as to hold the gain/bandwidth.

Since the present invention utilizes the frequency error to estimate the tracking state of the loop, and further adjusts the loop gain/bandwidth according to the tracking status, thus it can accelerate the pull-in time and lower the steady-state jitter.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings, FIG. 1 schematically shows a block diagram of a carrier recovery loop of the preferred embodiment according to the present invention.

DESCRIPTION OF THE PREFERRED EMBODIMENTS

Figure 2:
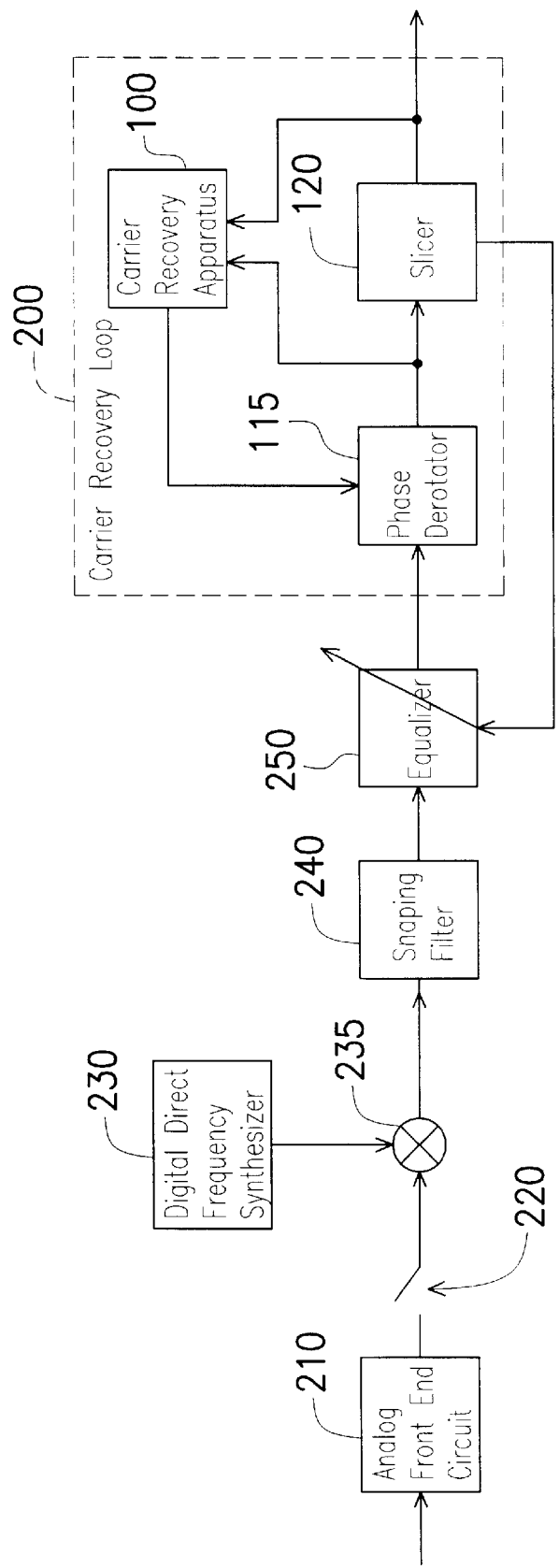
FIG. 2 schematically shows a block diagram of a quadrature amplitude modulation QAM-256 receiver of the preferred embodiment according to the present invention.

FIG. 2 schematically shows a block diagram of a quadrature amplitude modulation QAM-256 receiver of the preferred embodiment according to the present invention. The QAM receiver comprises an analog front end circuit 210, a sampling circuit 220, a mixer 235, a digital direct frequency synthesizer 230, a shaping filter 240, an equalizer 250, and a carrier recovery loop 200. The carrier recovery loop 200 comprises a phase derotator 115, a slicer 120, and a carrier recovery apparatus 100.

The analog front end circuit 210 receives a high-frequency RF (radio frequency) analog signal from channels, e.g. cable TV channels. For example, the high-frequency signal uses 500 MHz carrier frequency as the RF signal. The analog front end circuit 210 then performs the mixing, and filtering processes against the signal, so as to obtain a mid-frequency signal, e.g. a signal with a 5 MHz center frequency. However, the mid-frequency signal may have a frequency drift, e.g. a frequency drift up to ±100 KHz. The sampling circuit 220 samples the analog mid-frequency signal and converts it from analog to digital, the converted signal is subsequently transmitted to the mixer 235 in which the signal is mixed with an output from the digital direct frequency synthesizer 230, then the shaping filter 240 performs filtering process so as to obtain a base-frequency signal having the transmission data. The signal is then sent to the equalizer 250 for further processing to eliminate the channel effect, so as to obtain a signal that is not interfered by the channel.

The major function of the carrier recovery loop 200 is to obtain an accurate digital 'data, such as the decision out of +1, −1, +3, −3, etc. according to the signal that is not interfered by the channel. If a residual carrier frequency drift resulted from the inaccuracy of the environment and the analog front end circuit 210 exists in the signal that is not interfered by the channel mentioned above, the signal constellation will be rotated. In the case of the residual carrier frequency drift is 0 and the carrier phase drift exists, the signal constellation is offset by a certain angle. Meanwhile, the carrier recovery loop 200 locks these errors, and multiplies the angle of the error by the signal constellation, so as to rotate and correct the signal constellation. Therefore, the decision can be correctly made, and so as to obtain the decision out, which is in digital data format and do not have any transmission error.

The phase derotator 115 rotates and corrects a signal input into the carrier recovery loop 200 according to the correction parameter output from the carrier recovery apparatus 100, so as to correct the carrier phase or frequency error of the data signal, and further to obtain and output a decision in. The slicer 120 processes the decision in, so as to obtain the decision out having a digital data format. The decision out is the transmitted data received by the QAM-256 receiver. The carrier recovery apparatus 100 filters a noise component. According to the phase difference between the decision in and the decision out, so as to obtain a phase error. Moreover, the noise filtering operation is also related to the loop gain/bandwidth. The carrier recovery apparatus 100 further calculates a frequency error included in a frequency tracking related portion of the phase error, estimates a tracking status of the carrier recovery loop 200 based on the frequency error, and then adjusts the loop gain/bandwidth according to the tracking status. The carrier recovery apparatus 100 calculates an angle needed for the correct rotation for the signal constellation according to the phase error, and uses it to output a correction parameter. As a result, the carrier recovery loop 200 of the present invention is able to accelerate the pull-in time and lower the steady-state jitter.

Figure 1:
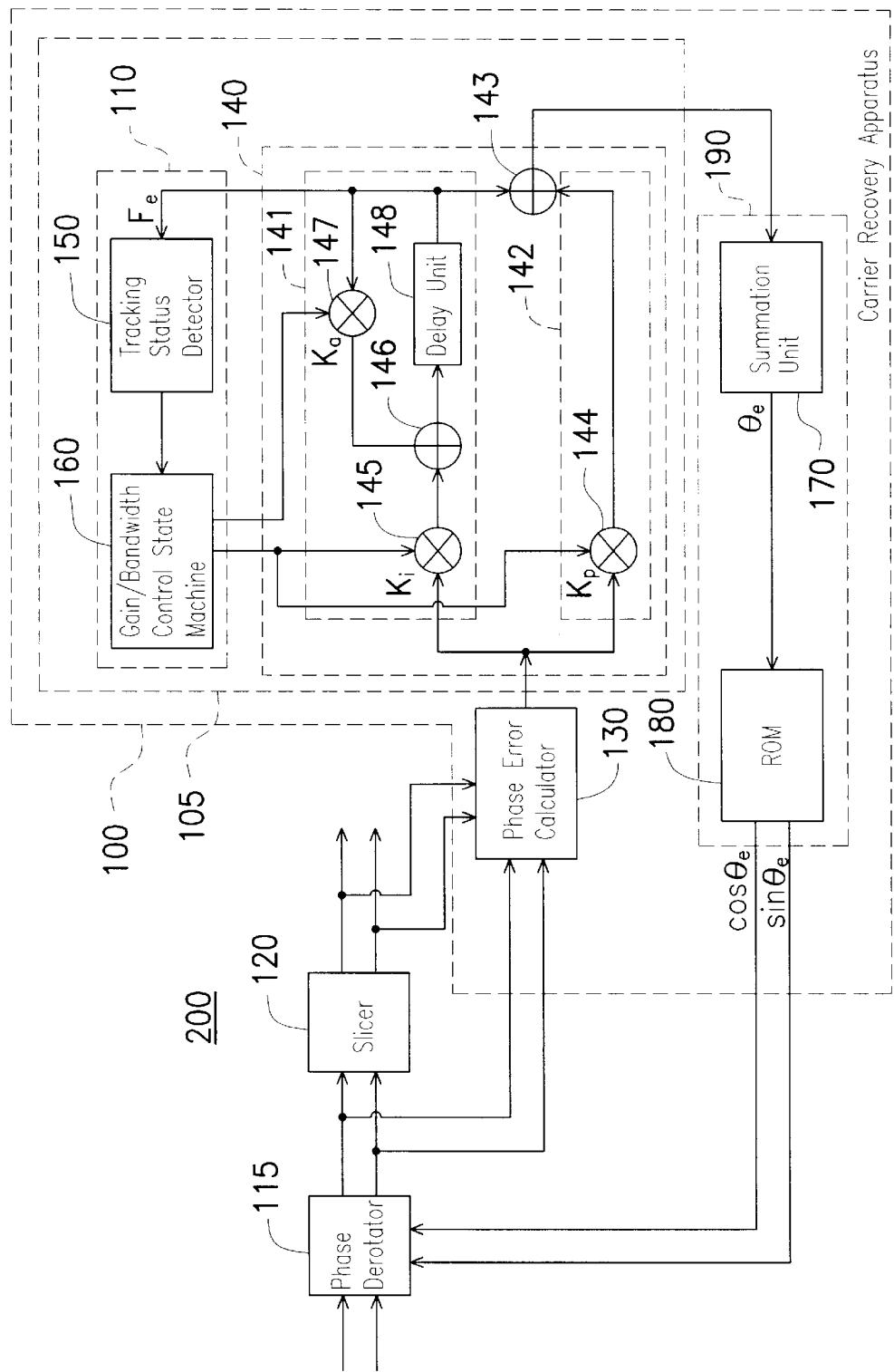

FIG. 1 schematically shows a block diagram of a carrier recovery loop of the preferred embodiment according to the present invention. An automatically adjusting gain/bandwidth loop filter 105 provided by the present invention is applied in a carrier recovery apparatus 100, and the carrier recovery apparatus 100 is suitable for the carrier recovery loop 200 provided. The carrier recovery loop 200 further comprises a phase derotator 115 and a slicer 120. As described above, the slicer 120 processes a decision in output from the phase derotator 115, so as to obtain a decision out. The automatically adjusting gain/bandwidth loop filter 105 of the present invention comprises a variable gain/bandwidth loop filter 140 and a tracking controller 110. Moreover, the carrier recovery apparatus 100 comprises a phase error calculator 130, an automatically adjusting gain/bandwidth loop filter 105, and a numerical control oscillator (OSC) 190. The tracking controller 110 mentioned above comprises a tracking status detector 150 and a gain/bandwidth control state machine 160. The numerical control oscillator 190 is composed of a summation unit 170 and a read only memory 180.

The phase error calculator 130 calculates an error between the decision in and the decision out according to the phase difference between them, so as to output a decision phase error. The decision phase error includes channel or environment noises. The variable gain/bandwidth loop filter 140 filters a noise component included in the decision phase error, and the variable gain/bandwidth loop filter 140 adjusts a gain/bandwidth inside the variable gain/bandwidth loop filter 140 according to the tracking control tuning parameter output from the tracking controller 110, so as to output the phase error and obtain a frequency error Fe included in the frequency tracking related portion of the phase error. One of the characteristics of the present invention is that the tracking controller 110 determines a tracking status of the carrier recovery apparatus 100 currently used specifically according to the frequency error Fe rather than purely according to the decision phase error or the phase error. The tracking controller 110 adjusts and outputs a tracking control tuning parameter that is used for adjusting the gain/bandwidth inside the variable gain/bandwidth loop filter 140 mentioned above. The numerical control oscillator 190 calculates an angle needed for the correct rotation for the signal constellation, so as to output a correction parameter to control the phase derotator 115 tuning the decision in, and thus to correct the carrier phase or frequency error of the data signal.

The tracking status detector 150 inside the tracking controller 110 determines the tracking status of the carrier recovery apparatus 100 currently used according to the frequency error Fe, so as to obtain a confidence value that represents the tracking status. The gain/bandwidth control state machine 160 adjusts and outputs a tracking control tuning parameter used for adjusting the gain/bandwidth inside the variable gain/bandwidth loop filter 140 according to the confidence value. The tracking control tuning parameter comprises a gain tuning parameter and a bandwidth tuning parameter. Wherein the gain tuning parameter is used for adjusting the gain inside the variable gain/bandwidth loop filter, and the bandwidth tuning parameter is used for adjusting the bandwidth inside the variable gain/bandwidth loop filter. The summation unit 170 inside the numerical control oscillator 190 summates and processes the phase error, so as to calculate the angle needed for the correct rotation. The sine value and cosine value that are represented by the angle needed for the correct rotation by the signal constellation is obtained by querying table from the conversion table storage media, e.g. read only memory 180. Both the sine value and the cosine value are the correction parameters.

The variable gain/bandwidth loop filter 140 inside the carrier recovery apparatus 100 comprises a frequency tracking branch 141, a phase tracking branch 142, and an adder 143. Wherein the phase tracking branch 142 weighs the decision phase error calculated from the phase error calculator 130 according to a ratio coefficient Kp of the gain tuning parameter included in the tracking control tuning parameter, so as to obtain a phase tracking related portion in the phase error. The phase tracking branch 142 comprises a multiplier 144, which is used to multiply the ratio coefficient Kp by the decision phase error. The frequency tracking branch 141 operates and processes the decision phase error according to the tracking control tuning parameter, so as to obtain a frequency tracking related portion in the phase error and obtain the frequency error Fe. The adder 143 summates the outputs from the phase tracking branch and the frequency tracking branch, so as to obtain the phase error.

The frequency tracking branch 141 comprises a multiplier 145, an adder 146, a multiplier 147, and a delay unit 148. Wherein the multiplier 145 multiplies an integral coefficient Ki of the gain tuning parameter included in the tracking control tuning parameter by the decision phase error. The adder 146 summates the outputs from the multiplier 145 and the multiplier 147, and outputs the summation result to the delay unit 148. The delay unit 148 is used to delay the output from the adder 146, so as to obtain the frequency error Fe. The multiplier 147 multiplies a bandwidth tuning parameter Ka included in the tracking control tuning parameter by the frequency error Fe, and feedbacks the result to the adder 146. Tuning and controlling the bandwidth tuning parameter Ka are also one of the characteristics of the present invention. The tracking characteristic of the carrier recovery apparatus 100 can be rapidly and efficiently impacted by adjusting the bandwidth tuning parameter Ka, e.g. adjusting from Ka=1 to Ka=0.5.

From observation of the frequency error Fe output from the frequency tracking branch 141, it is obvious that the carrier recovery apparatus 100 at least comprises two tracking status: the acquisition mode and the steady-state mode. The behaviors of the frequency error Fe in these two modes are quite different. In acquisition mode, the frequency error Fe continuously tracks up or down with a speed of certain slope until the residual carrier frequency offset can be found. Once it is found, the frequency error Fe starts to converge to a stable value, and the magnitude of this stable value depends on the magnitude and the direction of the residual carrier frequency offset. The value is going up when the offset is large, and the value is going down when the offset is small. Moreover, when the offset is negative, both the value and the tracking slope are negative. The tracking status detector is developed according to the above observation.

Figure 3:
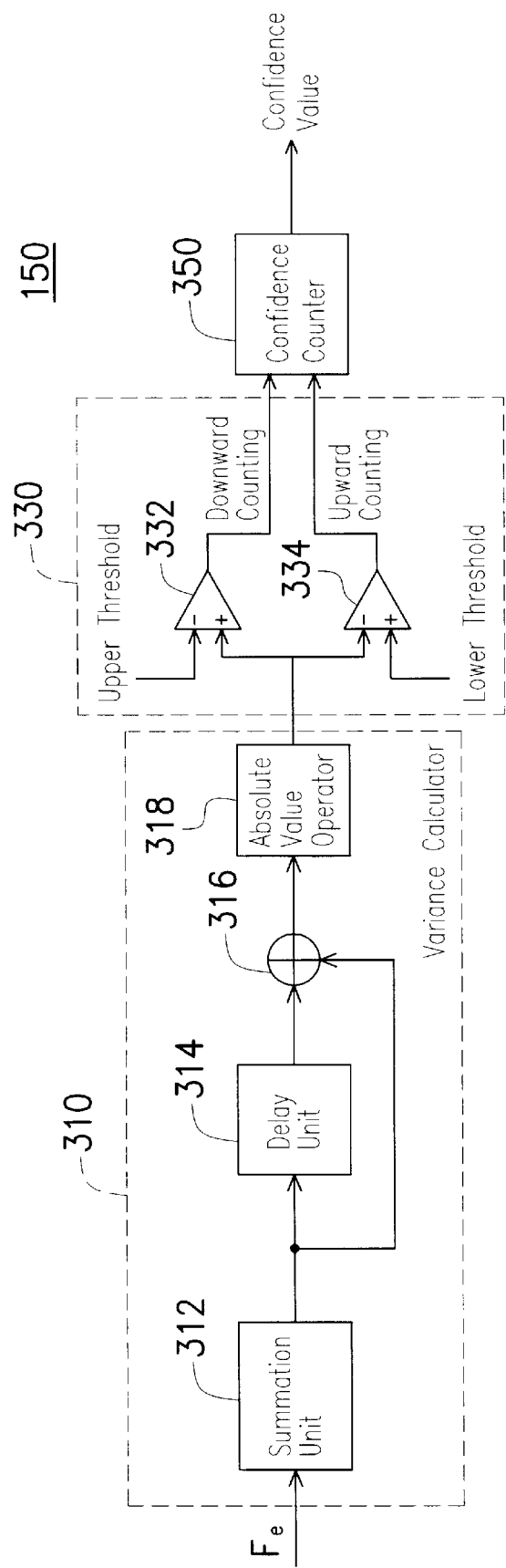
FIG. 3 schematically shows a block diagram of a tracking status detector of FIG. 1.

FIG. 3 schematically shows a block diagram of a tracking status detector of FIG. 1. From FIG. 3, the tracking status detector comprises a variation calculator 310, a comparators set 330, and a confidence counter 350. The variation calculator 310 comprises a summation unit 312, a delay unit 314, an adder 316, and an absolute value operator 318. The comparators set 330 comprise a comparator 332 and a comparator 334.

The variation calculator 310 calculates a representative variation value that relates to the variation of the frequency error Fe within a time period. Wherein the summation unit 312 receives the frequency error Fe, and summates the frequency error Fe within a time period, e.g. summates the k sequential frequency error Fe within a time period. The purpose of the summation is hopefully to obtain a signal varying trend rather than to obtain a signal instantaneous change. On the other hand, it also helps to reduce the miss-judgment caused by the jitter. The summation 312 outputs a summation value Fesum(1) that is obtained after summing the frequency error Fe. The delay unit 314 delays the summation value for a time unit. The adder 316 then subtracts the delayed summation value from the summation value. The absolute value operator 318 subsequently extracts an absolute value from the value output from the adder 316, so as to obtain the representative variation value $\text{Diff}_{Fesum}(1)$. The summation value and the representative variation value at time 1 are represented as following equations:

$$Fesum(l) = \sum_{n=(l-1)k+1}^{lk} Fe(n)$$

$\text{Diff}_{Fesum}(l) = |Fesum(l) - Fesum(l-1)|$

If the carrier recovery loop is in the acquisition mode, the representative variation value $\text{Diff}_{Fesum}(1)$ reflects the slope that appears in the variation of the frequency error Fe during the tracking acquisition process. The representative variation value at this time point reflects a synthesized effect of the slope of the frequency error Fe variation and the jitter. Therefore, after the absolute value is extracted, this value is much greater than the value obtained in the steady-state mode. Contrarily, if the carrier recovery loop is in the steady-state mode, the frequency error Fe is already in the steady-state, and the representative variation value $\text{Diff}_{Fesum}(1)$ only reflects the jitter effect. Therefore, the value at this time point is much less than the value obtained in the acquisition mode, and it is also more stable.

Figure 4:
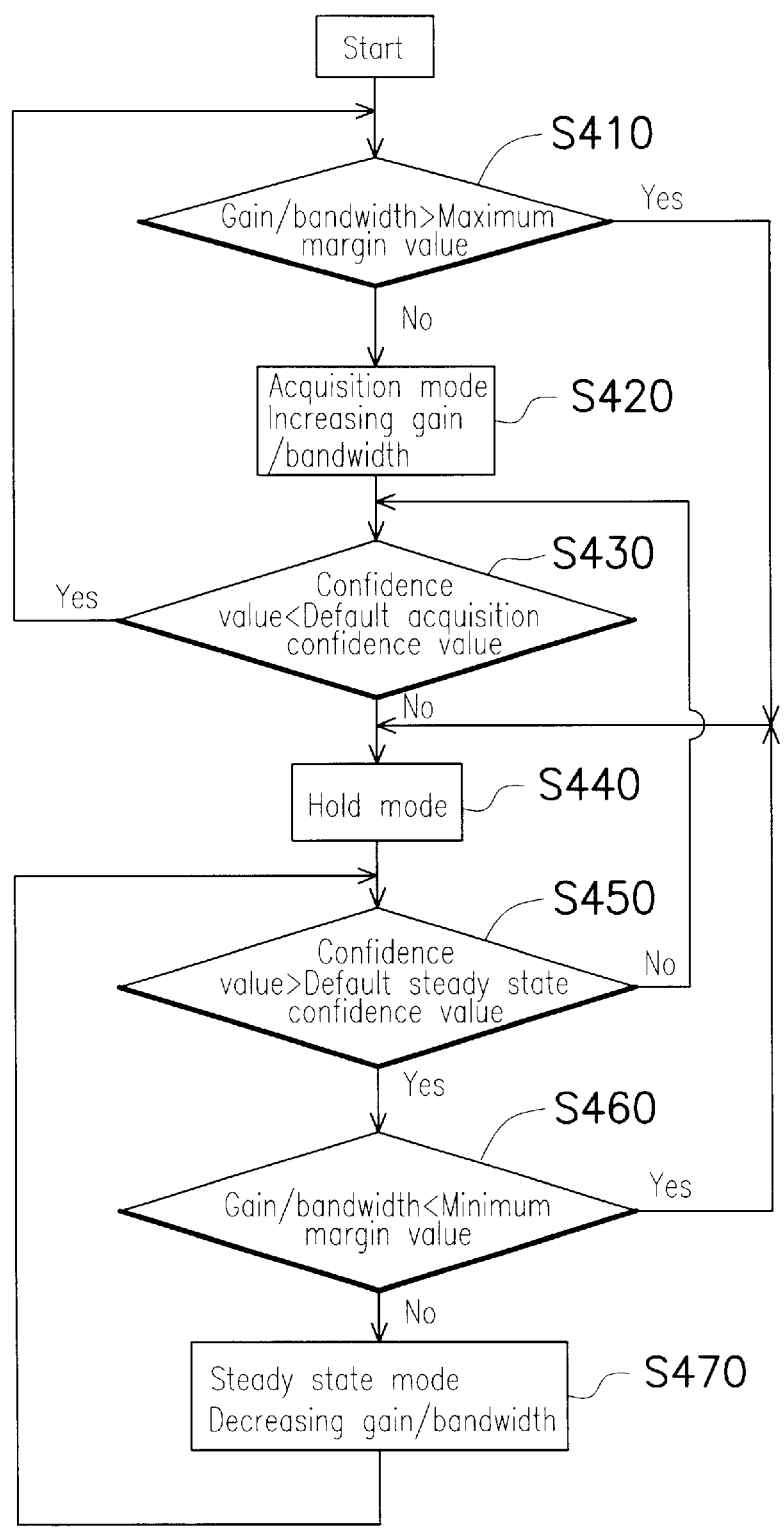
FIG. 4 schematically shows a flow chart of the method for tuning the gain/bandwidth according to the tracking status by the gain/bandwidth control state machine of FIG. 1.

Referring to FIG. 3, the comparators set 330 compare the representative variation value $\text{Diff}_{Fesum}1)$ with the default upper threshold and the lower threshold, so as to output a counting control parameter. The counting control parameter comprises a downward counting and an upward counting, and the upward counting and the downward counting of the counting control parameter increases or decreases a confidence value C(j) output from the confidence counter 350. The first comparator 332 compares the representative variation value with the upper threshold, and the second comparator 334 compares the representative variation value with the lower threshold. If the representative variation value is greater than the upper threshold value, it is considered that the carrier recovery loop intends to approach the acquisition mode, thus the first comparator 332 will activate the downward counting, so as to decrease the confidence value. If the representative variation value is less than the lower threshold value, it is considered that the carrier recovery loop intends to approach the steady-state mode, thus the second comparator 334 will activate the upward counting, so as to increase the confidence value. If the representative variation value is between the upper threshold and the lower threshold, it is in the vague stage that is prone to be mis-judged, and defined as approaching to the hold mode. Therefore, neither the downward counting nor the upward counting is activated, so that the confidence value can be held. These can be represented with following equations:

$C(j+1)=C(j)-1$, if $\text{Diff}_{Fesum}(j)$ is greater than the upper threshold $C(j+1)=C(j)+1$, if $\text{Diff}_{Fesum}(j)$ is less than the lower threshold $C(j+1)=C(j)$, otherwise FIG. 4 schematically shows a flow chart of the method for tuning the gain/bandwidth according to the tracking status by the gain/bandwidth control state machine of FIG. 1. Referring to FIG. 4, from the conclusion of the descriptions above and referring to the corresponding carrier recovery loop tracking status, the gain/bandwidth control state machine comprises the mode state of an acquisition mode, a hold mode, and a steady-state mode. Wherein, the acquisition mode is used to increase the gain/bandwidth; the hold mode is used to hold the gain/bandwidth; and the steady mode is used to reduce the gain/bandwidth. The operation of the gain/bandwidth control state machine is when a confidence value is less than a pre-determined default acquisition confidence value, the gain/bandwidth is increased; when the confidence value is greater than the pre-determined default steady-state confidence value, the gain/bandwidth is reduced; otherwise, the gain/bandwidth is held. Furthermore, before the gain/bandwidth of the variable gain/bandwidth loop filter is adjusted to a higher value by a gain/bandwidth control state machine, first determining whether the gain/bandwidth is greater than a maximum margin value or not, if it is, the gain/bandwidth is held; or before adjusting the gain/bandwidth of the variable gain/bandwidth loop filter to a lower value by the gain/bandwidth control state machine, determining whether the gain/bandwidth is less than a minimum margin value, if it is, the gain/bandwidth is also held. The method of the gain/bandwidth control state machine outputs and adjusts the tracking control tuning parameter so as to adjust the gain/bandwidth inside the loop filter is described hereinafter.

At first, step S410 is performed to determine whether the gain/bandwidth inside the loop filter is greater than the maximum margin value or not, if it is, jumping to step S440, i.e. entering into the hold mode. Otherwise, when the gain/bandwidth is not greater than the maximum margin value, step S420 is performed, i.e. entering into the acquisition mode, so as to increase the gain/bandwidth inside the loop filter. Step S430 is subsequently performed, if the confidence value is determined to be less than a pre-determined default acquisition confidence value, jumping to step S410 that determines whether the gain/bandwidth is greater than the maximum margin value or not again as a preparation operation before entering into the acquisition mode. Otherwise, when the confidence value is not less than the pre-determined default acquisition confidence value, step S440 is performed and then entering into the hold mode, so as to maintain the gain/bandwidth inside the loop filter as a constant. Then, step S450 is performed, if the confidence value is determined to be greater than a pre-determined default steady-state confidence value, step S460 is performed. Otherwise, when the confidence value is not greater than the pre-determined default steady-state confidence value, jumping to step S430 that determines whether the confidence value is less than the default acquisition-state confidence value or not. Whether the gain/bandwidth inside the loop filter is less than the default minimum margin value is determined in step S460, if the gain/bandwidth is less than the minimum margin value, jumping into step S440, i.e. entering into the hold mode. Otherwise, when the gain/bandwidth is not less than the minimum margin value, step S470 is performed and entering into the steady-state mode, so as to decrease the gain/bandwidth inside the loop filter, and then jumping to step S450 to repeat the step that determines whether the confidence value is greater than the default steady-state confidence value or not. It can be represented with following equations:

if $C(j)$ is less than the default acquisition confidence value, increasing the gain/bandwidth;

if $C(j)$ is greater than the default steady-state confidence value, reducing the gain/bandwidth; and otherwise, maintaining the gain/bandwidth as a constant.

It is defined in the present embodiment that the upper threshold value is $k^2s+2\sigma^2$ and the lower threshold is $2\sigma^2$, where s is a slope of the variation of the frequency error Fe and can be obtained via the division of a capture time and a residual carrier frequency, $\sigma$ is a standard deviation of a jitter of the frequency error Fe, and $\sigma^2$ is its variance. After i times comparison, the default steady-state confidence value is defined as $i \cdot (1-2Q(2\sigma))$, and the default acquisition confidence value is defined as $-i \cdot Q(2\sigma)$, where Q is the Q function of gaussian distribution function. If the representative variation value $\text{Diff}_{Fesum}(j)$ is less than $2\sigma^2$, according to the equation above, the confidence value is increased by 1, which means the carrier recovery loop is determined approaching and converging to the steady-state mode. If the representative variation value is greater than $k^2s+2\sigma^2$, the confidence value is decreased by 1, which means the carrier recovery loop is determined approaching to the acquisition mode. If the representative variation value is between $k^2s+2\sigma^2$ and $2\sigma^2$, the confidence counter is not operated. After i times comparison, if the confidence value is greater than $i \cdot (1-2Q(2\sigma))$, which means it is converged to the steady-state mode, so that the loop gain/bandwidth can be decreased. Otherwise, if the confidence value is less than $-i \cdot Q(2\sigma)$, which means it is in the acquisition mode, so that the loop gain/bandwidth can be increased. Similarly, if the confidence value is between $i \cdot (1-2Q(2\sigma))$ and $-i \cdot Q(2\sigma)$, which means it is in the hold mode, the loop gain/bandwidth is held.

Figure 5:
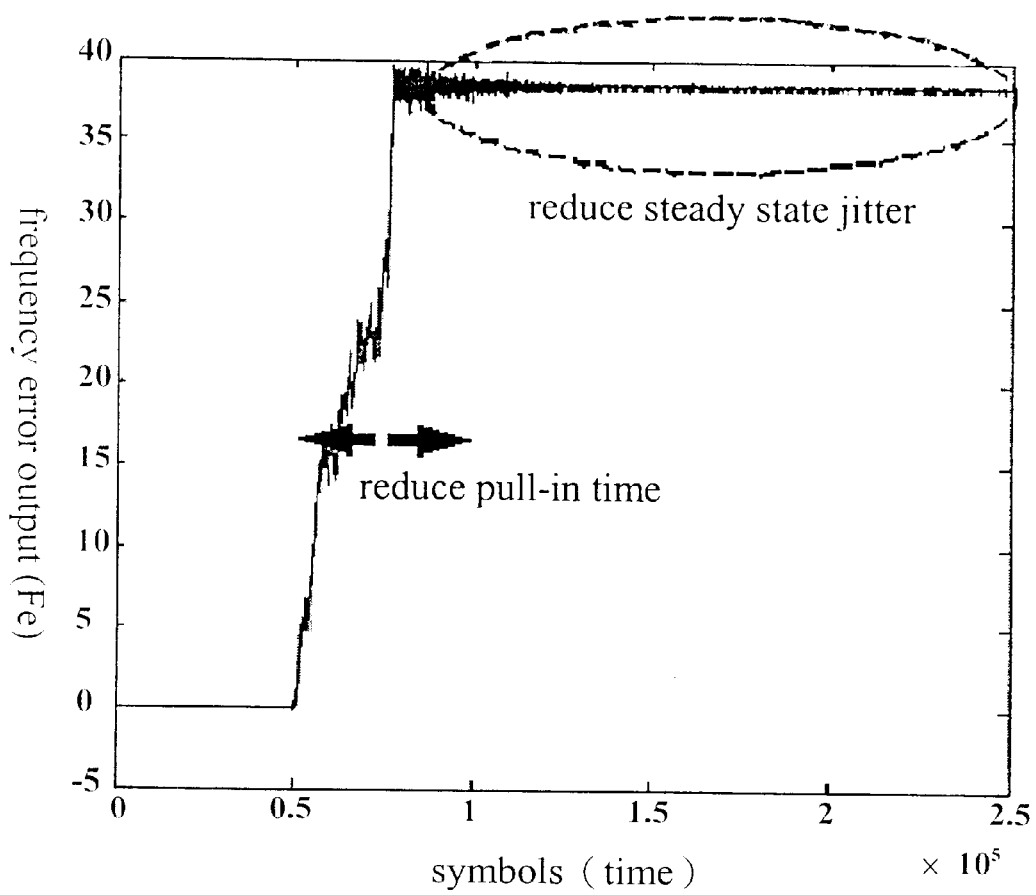
FIG. 5 schematically shows a diagram of the frequency error tracking result in a carrier recovery loop of the preferred embodiment according to the present invention.

FIG. 5 schematically shows a diagram of the frequency error tracking result in a carrier recovery loop of the preferred embodiment according to the present invention. As we can see from the diagram, since the frequency error is used to estimate the tracking status of the carrier recovery loop, and the loop gain/bandwidth is further adjusted according to the tracking status. The tracking capability is greatly improved so as to lower the pull-in time and jitters happened in the steady-state.

Figure 6:
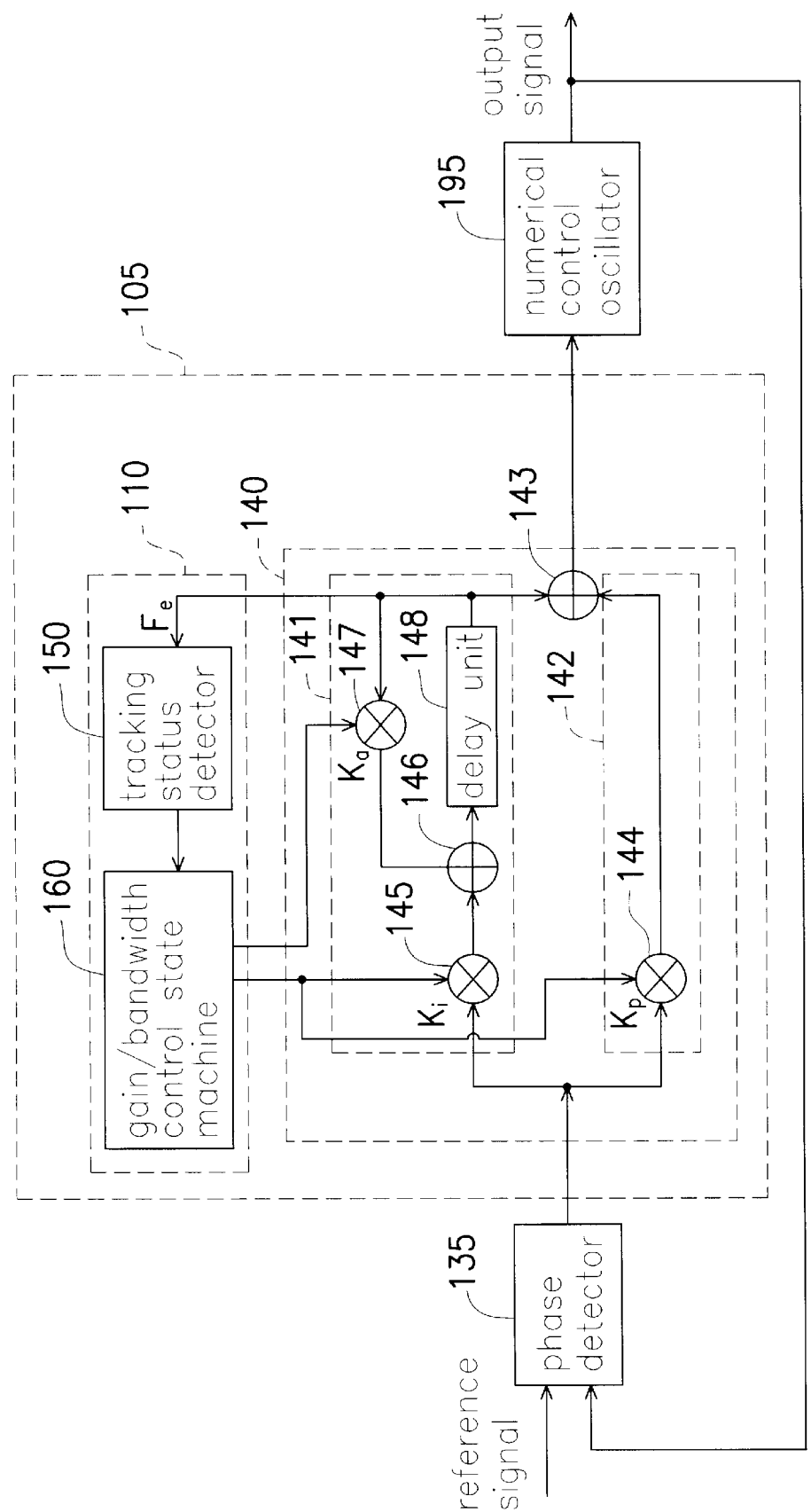
FIG. 6 schematically shows a block diagram of a digital phase lock loop of another better embodiment according to the present invention.

FIG. 6 schematically shows a block diagram of a digital phase lock loop of another better embodiment according to the present invention. Referring to FIG. 6, the digital phase lock loop comprises a phase detector 135, a numerical control oscillator 195, and an automatically adjusting gain/bandwidth loop filter 105 according to the present invention. The phase detector 135 calculates a first phase error that contains noise according to a difference between an input reference signal and an output signal. After the first phase error is input to the automatically adjusting gain/bandwidth loop filter 105 according to the present invention, the second phase error is subsequently generated and output. It should be apparent to those skilled in the related art that the method it uses and its operation principle are the same as the one used in the embodiment of the present invention shown in FIG. 1. Therefore, its detail operation is not described herein. The numerical control oscillator 195 adjusts and outputs its output signal according to the second phase error. Based on the same reason, the capture time of the digital phase lock loop and the steady-state jitter are both reduced in the present embodiment.

In summary the descriptions of each functional block from both embodiments mentioned above and from another aspect of the present invention, the automatically adjusting gain/bandwidth method for the variable gain/bandwidth loop filter is described hereinafter. First, receiving a first phase error via detecting and calculating, (wherein the first phase error is the decision phase error in the carrier recovery loop); then a noise component included in the first phase error mentioned above is filtered, so as to obtain a second phase error, and the gain/bandwidth needed for the filtering is adjusted according to a set of tracking control tuning parameters, so as to obtain a frequency error that relates to a frequency tracking portion in the second phase error; the tracking status of the loop currently used is further determined according to the frequency error, and the tracking control tuning parameter for adjusting the gain/bandwidth mentioned above is adjusted and output according to the tracking status.

The method for determining the tracking status of the loop currently used according to the preferred embodiment of the present invention mentioned above is described hereinafter. At first, a representative variation value that relates to a variation of the frequency error within a time period is calculated; then the representative variation value is compared with the default upper threshold and the lower threshold, so as to output a counting control parameter; a confidence value representing the tracking status is then increased/decreased and output according to the counting control parameter. The method for calculating the representative variation value comprises the steps of: at first, summing the frequency error within a time period, and outputting the summation value; then delaying the summation value by a time unit; subtracting the delayed summation value from the summation value; extracting an absolute value from the result after subtracting the delayed summation value from the summation value, so as to obtain a representative variation value. In addition, the counting control parameter comprises a downward counting and an upward counting. The method for obtaining the counting control parameter comprises the steps of: comparing the representative variation value with the upper threshold, when the representative variation value is greater than the upper threshold, the downward counting is activated, so as to decrease the confidence value; and comparing the representative variation value with the lower threshold, when the representative variation value is less than the lower threshold, the upward counting is activated, so as to increase the confidence value.

In accordance with the preferred embodiment of the present invention, the tracking status comprises an acquisition mode, a hold mode, and a steady-state mode. The method for adjusting and outputting the tracking control tuning parameter according to the tracking status, and so as to further adjust the gain/bandwidth is described hereinafter. When a confidence value is less than a pre-determined default acquisition confidence value, entering into the acquisition mode so as to increase the gain/bandwidth; when the confidence value is greater than the pre-determined default steady-state confidence value, entering into the steady-state mode so as to reduce the gain/bandwidth; otherwise, entering into the hold mode so as to hold the gain/bandwidth. The method mentioned above can determine whether the gain/bandwidth is greater than the default maximum margin value before increasing the gain/bandwidth, if it is, entering into the hold mode so as to hold the gain/bandwidth; or determine whether the gain/bandwidth is less than the default minimum margin value before reducing the gain/bandwidth, if it is, entering into the hold mode so as also to hold the gain/bandwidth.

Since the present invention utilizes the frequency error to estimate the tracking state of the loop, and further adjusts the loop gain/bandwidth according to the tracking status, thus it can accelerate the pull-in time and lower the steady-state jitter.

Although the invention has been described with reference to a particular embodiment thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. An automatically adjusting gain/bandwidth loop filter, comprising:
   a variable gain/bandwidth loop filter, used to receive a first phase error and filter a noise component included in the first phase error, to adjust a gain/bandwidth inside the variable gain/bandwidth loop filter according to a tracking control tuning parameter, and output a second phase error and a frequency error that relates to a frequency tracking portion in the second phase error; and
   a tracking controller, coupled to the variable gain/bandwidth loop filter, used to determine a tracking status according to the frequency error, and to adjust and to output the tracking control tuning parameter according to the frequency error.

2. The automatically adjusting gain/bandwidth loop filter of claim 1, wherein the tracking controller comprises:
   a tracking status detector, coupled to the variable gain/bandwidth loop filter, used to determine the current tracking status according to the frequency error, so as to obtain a confidence value that represents the tracking status; and
   a gain/bandwidth control state machine, coupled to the tracking status detector and the variable gain/bandwidth loop filter, used to adjust and to output the tracking control tuning parameter according to the confidence value.

3. The automatically adjusting gain/bandwidth loop filter of claim 2, wherein the tracking status detector comprises:
   a variation calculator, coupled to the variable gain/bandwidth loop filter, used to calculate a representative variation value that relates to a variation of the frequency error within a time period;
   a comparators set, coupled to the variation calculator, used to compare the representative variation value with a upper threshold and a lower threshold, so as to output a counting control parameter; and
   a confidence counter, coupled to the comparators set, used to increase/decrease the output confidence value according to the counting control parameter.

4. The automatically adjusting gain/bandwidth loop filter of claim 3, wherein the variation calculator comprises:
   a summation un it, used to receive the frequency error, and summate the frequency error within a time period, so as to output a summation value;

a delay unit, coupled to the summation unit, used to delay the summation value by a time unit;

an adder, coupled to the delay unit and the summation unit, used to subtract the delayed summation value from the summation value; and an absolute value operator, coupled to the adder, used to extract an absolute value from an output value of the adder, so as to obtain the representative variation value.

5. The automatically adjusting gain/bandwidth loop filter of claim 3, wherein the counting control parameter comprises a downward counting and a upward counting, and the comparators set comprises:

a first comparator, used to compare the representative variation value with the upper threshold, if the representative variation value is greater than the upper threshold, the downward counting is activated, so as to decrease the confidence value; and a second comparator, used to compare the representative variation value with the lower threshold, if the representative variation value is less than the lower threshold, the upward counting is activated, so as to increase the confidence value.

6. The automatically adjusting gain/bandwidth loop filter of claim 2, wherein the gain/bandwidth control state machine comprising:

an acquisition mode, used to increase the gain/bandwidth;

a hold mode, used to hold the gain/bandwidth; and a steady mode, used to reduce the gain/bandwidth;

wherein, when the confidence value is less than a pre-determined default acquisition confidence value, the gain/bandwidth is increased, when the confidence value is greater than the pre-determined default steady-state confidence value, the gain/bandwidth is reduced, otherwise, the gain/bandwidth is held.

7. The automatically adjusting gain/bandwidth loop filter of claim 6, wherein:

before the gain/bandwidth control state machine increasing the gain/bandwidth, determining whether the gain/bandwidth is greater than a maximum margin value or not, if the gain/bandwidth is greater than the maximum margin value, holding the gain/bandwidth; and before the gain/bandwidth control state machine reducing the gain/bandwidth, determining whether the gain/bandwidth is less than a minimum margin value or not, if the gain/bandwidth is less than the minimum margin value, holding the gain/bandwidth.

8. The automatically adjusting gain/bandwidth loop filter of claim 2, wherein the tracking control tuning parameter comprises a gain tuning parameter and a bandwidth tuning parameter, the gain tuning parameter is used to adjust the gain inside the variable gain/bandwidth loop filter, and the bandwidth tuning parameter is used to adjust the bandwidth inside the variable gain/bandwidth loop filter.

9. The automatically adjusting gain/bandwidth loop filter of claim 1, wherein the variable gain/bandwidth loop filter comprises:

a phase tracking branch, used to weigh the first phase error according to the tracking control tuning parameter, so as to obtain a phase tracking related portion inside the second phase error;

a frequency tracking branch, used to operate the first phase error according to the tracking control tuning parameter, so as to obtain a frequency tracking related portion inside the second phase error; and an adder, coupled to the phase tracking branch and the frequency tracking branch, used to summate the outputs of the phase tracking branch and the frequency tracking branch, so as to obtain the second phase error.

10. The automatically adjusting gain/bandwidth loop filter of claim 9, wherein the phase tracking branch comprises a multiplier, used to multiply a ratio coefficient of a gain tuning parameter inside the tracking control tuning parameter by the first phase error.

11. The automatically adjusting gain/bandwidth loop filter of claim 9, wherein the frequency tracking branch comprises:

a first multiplier, used to multiply an integral coefficient of a gain tuning parameter inside the tracking control tuning parameter by the first phase error;

an adder, coupled to the first multiplier;

a delay unit, coupled to the adder, used to delay the output of the adder, so as to obtain the frequency error; and a second multiplier, coupled to the delay unit and the adder, used to multiply a bandwidth tuning parameter inside the tracking control tuning parameter by the frequency error;

wherein the adder summates the outputs from the first multiplier and the second multiplier, and outputs the result to the delay unit.

12. The automatically adjusting gain/bandwidth loop filter of claim 1, suitable for a carrier recovery apparatus inside a carrier recovery loop, wherein the carrier recovery loop further comprises a phase derotator and a slicer, the slicer processes a decision in output from the phase derotator so as to obtain a decision out, the carrier recovery apparatus further comprises:

a phase error calculator, coupled to the variable gain/bandwidth loop filter, the slicer and the phase derotator, used to calculate a first phase error according to the phase difference between the decision in and the decision out; and a numerical control oscillator, coupled to the variable gain/bandwidth loop filter and the phase derotator, used to calculate an angle needed for correct rotation according to the second phase error, so as to output a correction parameter for controlling the phase derotator to adjust the decision in.

13. The automatically adjusting gain/bandwidth loop filter of claim 12, wherein the numerical control oscillator comprises:

a summation unit, coupled to the loop filter, used to summate the second phase error, so as to calculate an angle needed for correct rotation; and a conversion table storage media, coupled to the summation unit, used to query table for obtaining the correction parameter according to the output from the summation unit, so as to control the phase derotator to adjust the decision in.

14. The automatically adjusting gain/bandwidth loop filter of claim 1, suitable for a digital phase lock loop, wherein the digital phase lock loop further comprises:

a phase detector, coupled to the variable gain/bandwidth loop filter, used to calculate the first phase error according to a difference between a reference signal and an output signal; and a numerical control oscillator, coupled to the variable gain/bandwidth loop filter and the phase detector, used to output correct rotation angles according to the second phase error.

15. An automatically adjusting gain/bandwidth method for a variable gain/bandwidth loop filter, comprising the steps of:

receiving a first phase error;

adjusting a gain/bandwidth of the variable gain/bandwidth loop filter according to a tracking control tuning parameter to filter a noise component included in the first phase error, so as to obtain a second phase error, and to obtain a frequency error that relates to a frequency tracking portion inside the second phase error; and determining a current tracking status according to the frequency error, and adjusting and outputting the tracking control tuning parameter according to the tracking status.

16. The automatically adjusting gain/bandwidth method for the variable gain/bandwidth loop filter of claim 15, wherein the step for determining the current tracking status according to the frequency error further comprises the steps of:

calculating a representative variation value that relates to the frequency error variation within a time period;

comparing the representative variation value with a upper threshold and a lower threshold, so as to obtain a counting control parameter; and increasing/reducing and outputting a confidence value that represents the tracking status according to the counting control parameter.

17. The automatically adjusting gain/bandwidth method for the variable gain/bandwidth loop filter of claim 16, wherein the step for calculating the representative variation value further comprises the steps of:

summing the frequency error within a time period, so as to output a summation value;

delaying the summation value by a time unit;

subtracting the delayed summation value from the summation value; and extracting an absolute value from the result after subtracting the delayed summation value from the summation value, so as to obtain the representative variation value.

18. The automatically adjusting gain/bandwidth method for the variable gain/bandwidth loop filter of claim 16, wherein the counting control parameter comprises a downward counting and an upward counting, and the step for obtaining the counting control parameter further comprises the steps of:

comparing the representative variation value with the upper threshold, if the representative variation value is greater than the upper threshold, the downward counting is activated, so as to decrease the confidence value; and comparing the representative variation value with the lower threshold, if the representative variation value is less than the upper threshold, the upward counting is activated, so as to increase the confidence value.

19. The automatically adjusting gain/bandwidth method for the variable gain/bandwidth loop filter of claim 16, wherein the tracking status comprises an acquisition mode, a hold mode, and a steady-state mode, and the step for adjusting and outputting the tracking control tuning parameter according to the tracking status, so as to further adjust the gain/bandwidth further comprises the steps of:

when the confidence value is less than a pre-determined default acquisition confidence value, entering into the acquisition mode so as to increase the gain/bandwidth;

when the confidence value is greater than a pre-determined default steady-state confidence value, entering into the steady-state mode so as to reduce the gain/bandwidth; and otherwise, entering into the hold mode so as to hold the gain/bandwidth.

20. The automatically adjusting gain/bandwidth method for the variable gain/bandwidth loop filter of claim 19, wherein the step for adjusting and outputting the tracking control tuning parameter according to the tracking status so as to further adjust the gain/bandwidth further comprises the steps of:

before increasing the gain/bandwidth, determining whether the gain/bandwidth is greater than a maximum margin value or not, if the gain/bandwidth is greater than the maximum margin value, entering into the hold mode step so as to hold the gain/bandwidth; and before reducing the gain/bandwidth, determining whether the gain/bandwidth is less than a minimum margin value or not, if the gain/bandwidth is less than the minimum margin value, entering into the hold mode step so as to hold the gain/bandwidth.

\* \* \* \* \*